United States Patent [19]

Preis et al.

[11] Patent Number: 4,891,728

[45] Date of Patent: Jan. 2, 1990

[54] CIRCUIT ARRANGEMENT FOR LIMITING THE SWITCH-ON CURRENT AND FOR PROVIDING AN OVER VOLTAGE PROTECTION IN SWITCH MODE POWER SUPPLY DEVICES

[75] Inventors: Josef Preis, Munich; Ulf Schwarz, Pullach; Gerhard Stolz, Germering, all of Fed. Rep. of Germany

[73] Assignee: SIemens Aktiengesellschaft, Berlin and Munich, Fed. Rep. of Germany

[21] Appl. No.: 127,370

[22] Filed: Dec. 2, 1987

[30] Foreign Application Priority Data

Dec. 23, 1986 [DE] Fed. Rep. of Germany ....... 3644321

[51] Int. Cl.⁴ .............................................. H02H 9/04
[52] U.S. Cl. ....................................... 361/18; 323/276
[58] Field of Search .................... 361/18, 93, 98, 100, 361/101, 111; 323/908, 276, 277

[56] References Cited

U.S. PATENT DOCUMENTS

| | | | |
|---|---|---|---|
| 3,432,726 | 3/1969 | Meyer et al. | 361/18 X |
| 3,582,713 | 6/1971 | Till | 361/18 X |
| 3,703,679 | 11/1972 | Heidt | 361/18 X |
| 3,917,980 | 11/1975 | Weisbrod | 361/18 |
| 3,935,527 | 1/1976 | Michelet et al. | |
| 3,959,713 | 5/1976 | Davis et al. | 361/18 X |
| 4,021,701 | 5/1977 | Davies | 361/18 |
| 4,428,016 | 1/1984 | Brasfield | 361/18 |
| 4,438,473 | 3/1984 | Cawley et al. | 361/18 |

FOREIGN PATENT DOCUMENTS 2143908 3/1973 Fed. Rep. of Germany .
310335 9/1971 U.S.S.R. ................................. 361/18

OTHER PUBLICATIONS

J. E. Buchanan, Limiting A Filter Capacitor's Turn-On Inrush Current, Electronics International, vol. 56, no. 23, p. 133, Nov. 1983.
Nathan O. Sokal, Circuits Eliminate Power-Supply Surge Currents, E.D.N. Electrical Design News, vol. 30, no. 20, Sep. 1985, pp. 141–146.

Primary Examiner—William M. Shoop, Jr.
Assistant Examiner—A. Jonathan Wysocki
Attorney, Agent, or Firm—Hill, Van Santen, Steadman & Simpson

[57] ABSTRACT

A circuit arrangement for limiting the switch-on current and for providing an over voltage protection in switch mode power supply devices. The circuit arrangement has an input-end storage capacitor which forms a low-ohmic voltage source for a connected power supply arrangement. A power supply device of this type is to be provided with a circuit which both limits the switch-on current and also provides a protection against over voltages across the storage capacitor. This is achieved with the assistance of a field-effect transistor which is arranged between the supply voltage source and the storage capacitor and which is controlled both by an amplifier in terms of current limitation and by a delay element in terms of delayed switch-on. The power supply device is particularly suitable for plug-in assemblies having voltage inverters for the supply of electrical communications transmission technology equipment.

13 Claims, 2 Drawing Sheets

CIRCUIT ARRANGEMENT FOR LIMITING THE SWITCH-ON CURRENT AND FOR PROVIDING AN OVER VOLTAGE PROTECTION IN SWITCH MODE POWER SUPPLY DEVICES

BACKGROUND OF THE INVENTION

The invention relates to a circuit arrangement for limiting the switch-on current and for providing an over voltage protection in switch mode power supply devices.

Switch mode power supply arrangements generally include, in the input circuit, a comparatively large capacitance, normally formed by an electrolytic capacitor. This capacitance serves as a low-ohmic source for the primary-side pulse currents of the converter circuit and, together with a series-connected inductance of a input filter, is fundamentally responsible for the level and form of the switch-on current.

The charging current which flows into the storage capacitor when the power supply device in question is plugged-in or switched-on, can trigger series-connected fuses and in the case of plug-in power supply devices can destroy the plug pins when the device, in the form of a slide-in module, insert module or plug-in assembly, become live.

It is also normal practice to subject power supply devices of the type referred to in the introduction to a test in which the power supply device is supplied at its input with voltage pulses of a specific form and level. These pulses can destroy sensitive components, such as for example semiconductors.

SUMMARY OF THE INVENTION

The object of the present invention is to provide a power supply device with a circuit which both limits the switch-on current and also ensures protection against over voltages across the storage capacitor.

For this purpose a safety cut-out of appropriate magnitude for the switch-on current can be selected, and as a protection against over voltages a Zener diode (hereinafter referred tp as a Z-diode) can be used which, however, absorbs a level of energy which increases super-proportionally to the level of the voltage pulse and therefore may itself be at risk.

Considerations within the framework of the invention have indicated that in order to fulfill the above-described objective it is expedient to connect the storage capacitor in series with a control element and a) at the instant at which the power supply device is plugged-in or switched-on, to limit the input current either to zero or to a selectable value which is sufficiently low for the life duration of the plug-in contacts or switches, assuming relatively frequent plugging or switching processes, b) after a selectable time to limit the input current to a higher value which on one hand is sufficiently high for the start-up of the power supply arrangement and on the other hand is still permissable in view of predetermined switch-on current requirements. This value may need to be such that the permissable plug contact load in the plugged-in state is not exceeded, c) following the start-up of the power supply, to drive the control component in such manner that the lowest possible losses are incurred, d) following the arrival of an over voltage pulse and the resultant current increase, to re-implement the current limitation described under b as a result of which the temporary input-end voltage increase can only insubstantially manifest at the input of the following power supply arrangement due to the input capacitance.

In accordance with the present invention, the power supply device has a storage capacitor which forms a low-ohmic voltage source for a connected power supply arrangement. Here the storage capacitor can be connected to the supply voltage source via a switch and/or plug. A source-drain path of a field-effect transistor and a current measuring resistor can be located in the same or different arms of the supply circuit.

These measures result in the advantage that, using one and the same control element, it is possible to simultaneously achieve a time-graduated protection against over currents and an effective protection against over voltages.

The circuit arrangement has for the limitation of the charging current which flows into the storage capacitor and for the limitation of a charging voltage which occurs across the storage capacitor between a supply voltage source and the storage capacitor a series circuit consisting of the source-drain path of the field-effect transistor and a current measuring resistor. A gate of the field-effect transistor is connected to an output of an OR-circuit. A first input of the OR-circuit is connected to an output of an amplifier which is connected to the current measuring resistor and which forms a current limiter. The other input is connected to an output of a delay component which, when the discharged storage capacitor is connected to the supply voltage source at the end of a predetermined delay time, the delay component emits from its output a positive potential which renders the field-effect transistor conductive.

The OR-circuit can consist of two diodes, where the delay circuit is formed by an RC-component and the field-effect transistor has its own gate series resistor. In a further development, the resistor of the RC-component advantageously simultaneously serves as gate series resistor.

In another embodiment, the amplifier is connected to an external reference voltage source. In a further development, advantageously an external reference voltage source is not required.

In yet a further development of the invention the delay component is designed in such manner that before the end of the delay time it emits a potential which blocks the field-effect transistor. In a further development, before the end of the delay time the enabling potential is disconnected. In this case the field-effect transistor is blocked due to the absence of the enabling potential in combination with the resistor which is active between the gate and the source.

The present invention also advantageously provides a protection for the circuit arrangement in the case of inverse currents in the charging circuit of the storage capacitor.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures in which like reference numerals identify like elements, and in which:

FIGS. 1 to 3 are schematic circuits each representing a circuit arrangement for limiting the switch-on current and for providing an over-voltage protection in a switch mode power supply device, wherein the charging circuit of a storage capacitor contains a field-effect transistor which serves as control element, and more specifically wherein, FIG. 1 is a diagram of a circuit arrangement comprising a differential amplifier as an amplifier for the current limitation and comprising an RC-component as delay element, FIG. 2 is a diagram of a circuit arrangement in which a bipolar transistor simultaneously serves as a reference voltage generator and as a comparator for the current limitation, and FIG. 3 is a diagram of a circuit arrangement in which the storage capacitor forms part of a delay element.

DESCRIPTION OF THE PREFERRED EMBODIMENT

Figure 1:
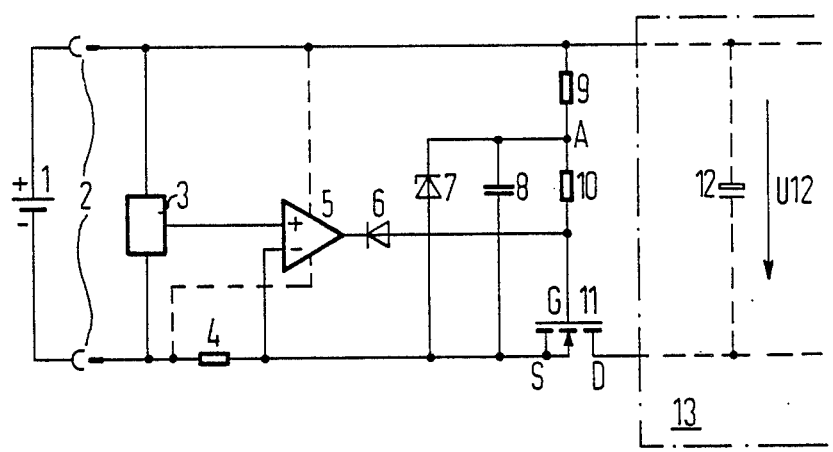

The circuit arrangement shown in FIG. 1, which serves to limit the switch-on current and to provide an over voltage protection, is arranged between a supply network, having the supply voltage source 1 and the storage capacitor 12 of the power supply arrangement 13.

The circuit arrangement which serves to limit the switch-on current and to provide an over voltage protection is accommodated in one and the same device together with the power supply arrangement which is to be protected, and can be connected to the supply voltage source 1 via the contacts 2 of a multiple plug connector which is not shown in detail in FIG. 1. On one side the storage capacitor 12 is connected via a plug contact to the plus pole of the supply voltage source 1 and on the other side is connected to the minus pole of the supply voltage source 1 via the drain-source path of the field-effect transistor 11, the series-connected current measuring resistor 4, which serves as an actual value generator, and a further contact of the multiple plug connector.

The gate G of the field-effect transistor 11, which serves as control element, is connected via the diode 6 to the output of the amplifier element 5 and via the resistor 10 to the output A of an RC-component composed of the resistor 9 and the capacitor 8. The series arrangement of the capacitor 8 and resistor 9 is connected to the supply voltage source 1. The connection point of capacitor 8 and resistor 9 forms the output A of the delay element. The Z-diode 7 is arranged in parallel to the capacitor 8. The Z-diode 7 is poled in such manner that it limits the voltage occurring across the capacitor 8 to the value of its Zener voltage.

The amplifier element 5, which serves to carry out the theoretical-actual value comparison, is formed by a differential amplifier, whose non-inverting plus input is connected to the theoretical value generator 3, such as a reference voltage generator, and whose inverting minus input is connected to the connection point of current measuring resistor 4 and source of the field-effect transistor 11. The theoretical value generator 3 and the amplifier element 5 are supplied with operating voltage from the supply voltage source 1 where appropriate via suitable supply devices. The diode 6 is poled in such manner that it is blocked in the case of the plus potential at the output of the differential amplifier 5. The diode 6 can be dispensed with if the differential amplifier 5 has an open collector output so that additional decoupling measures at its output are unnecessary.

If a voltage is connected to the input of the circuit arrangement formed by the contacts 2, initially no charging current flows into the capacitor 12 because the capacitor 8 is still discharged. At its output the amplifier 5 now emits a positive voltage which however, on account of the diode 6 which serves as decoupling diode, cannot appear at the gate G of the field-effect transistor or MOS-FET 11.

At the same time the capacitor 8 is slowly charged via the resistor 9 which serves as charging resistor. As soon as, following a delay time governed by the charging time constant, the voltage across the capacitor 8, and thus the gate voltage of the MOS-FET 11, has risen to the threshold voltage of the MOS-FET 11 of approx. 3V, the MOS-FET starts to become low-ohmic and allows current to flow into the connected power supply arrangement 13. When this current reaches a level at which its voltage drop across the current measuring resistor 4 reaches the reference voltage emitted by the reference voltage generator 3, the output voltage of the amplifier 5 moves towards minus potential and by directly acting on the gate of the MOS-FET 11 limits the current to the thus determined value. Due to the resistor 10, which is located between the capacitor 8 and the decoupling diode 6, this action can take place independent of the voltage across the capacitor 8. As soon as the input capacitor 12 of the power supply arrangement 13 has charged and the latter is in operation, the current falls to the static input current of the arrangement, the amplifier 5 becomes positive again at its output and the capacitor 8 can now be fully charged via the charging resistor 9 to the voltage determined by the Z-diode 7. If the level of this voltage is sufficiently high, e.g. approx. 10V, the MOS-FET 11 is low-ohmic and thus a low-loss operation is ensured.

On the arrival of an over voltage pulse, it will be assumed that the connected power supply arrangement is in operation, the capacitor 8 is charged to the limitation voltage, the amplifier 5 is driven positive and is currentless at its output, and thus the MOS-FET 11 is low-ohmic. As a result of the rapid rise in voltage at the input of the amplifier arrangement and across the contacts 2, the input current rapidly rises, due to the input capacitance of the power supply arrangement, but, as at the time of switch-on, is limited to the specified value by the comparator circuit, amplifier 5, decoupling diode 6 and MOS-FET 11, where the resistor 10 permits the undelayed intervention of the amplifier 5.

Due to the current-limiting influence of the circuit arrangement, the high-level but short over voltages which occur in supply networks lead to only a small increase in the voltage U12 at the input of the power supply arrangement 13. The voltage difference occurs across the MOS-FET 11 of the protective circuit, which transistor is to be dimensioned for this voltage. At the end of the over voltage the circuit arrangement resumes the normal state with the MOS-FET 11 driven to full capacity.

Figure 2:
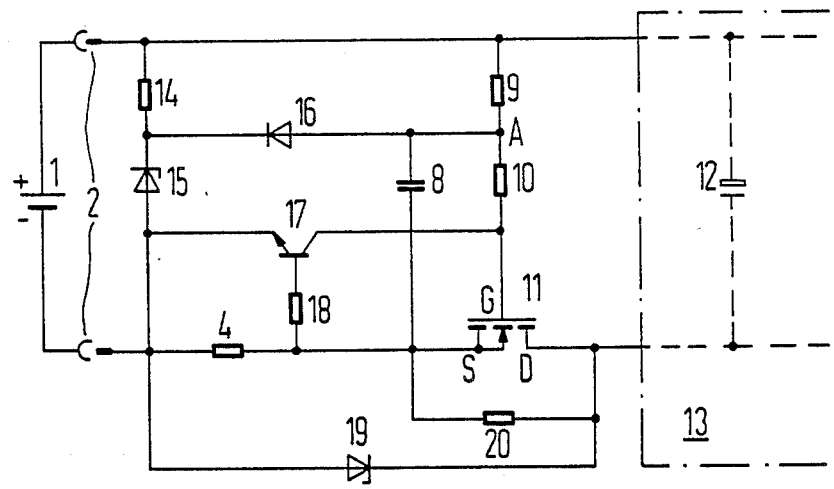

The circuit arrangement shown in FIG. 2 is largely identical to that shown in FIG. 1. In contrast to FIG. 1, the amplifier is formed by the bipolar transistor 17 whose emitter leads to the minus pole of the supply voltage source 1, whose collector leads to the gate electrode G of the field effect transistor 11 and whose base leads via the resistor 18 to the connection point of current measuring resistor 4 and source S of the field-effect transistor 11. Furthermore, in place of the Z-diode 7 provided in FIG. 1, a voltage limiting arrangement is provided wherein the capacitor 8 is connected to the output A of the RC-component and, via the diode 16, which is poled in the conducting direction, to the output of a voltage stabilizing arrangement. The voltage stabilizing arrangement consists of a series arrangement which is connected to the supply voltage source 1 and which is composed of the resistor 14 and the Z-diode 15, which is poled in the blocking direction for the supply voltage. Here the anodes of the Z-diode 15 and the diode 16 are connected to one another. The cathode of the Z-diode 15 is connected to the minus pole of the supply voltage source 1. In contrast to FIG. 2, the Z-diode 15 can be connected to the source S of the field-effect transistor 11 instead of to the minus pole.

Furthermore, the resistor 20 is arranged parallel to the drain-source path of the field-effect transistor 11 as a load-relieving resistor. This resistor 20 serves to reduce the pulse load to the MOS-FET 11. As a result, switch-on takes place not in the event of a current 0 but a current governed by the input voltage and the magnitude of the resistor 20. The theoretical value and reference voltage generator 3 and the amplifier 5 in accordance with FIG. 1 are formed by one single transistor 17. The threshold voltage across its base-emitter path forms the theoretical value. The resistor 18 is provided as a base-protection resistor. The decoupling diode 6 in accordance with FIG. 1 is thus not necessary.

The limiting circuit which consists of the switching means 14, 15, 16 and which serves to limit the gate voltage is provided in particular for comparatively long delay times, thus for a very high-ohmic charging resistor 9. For this reason a separate feed-in of the Z-diode 15 via the resistor 14 is provided. The voltage across the charging capacitor 8 is limited by means of the overflow diode 16.

For the voltage protection of the MOS-FET 11, the Z-diode 19 is connected with an appropriate voltage via the negative arm of the protective circuit. This Z-diode 19 simultaneously serves as protection in the case of inverse currents.

Figure 3:
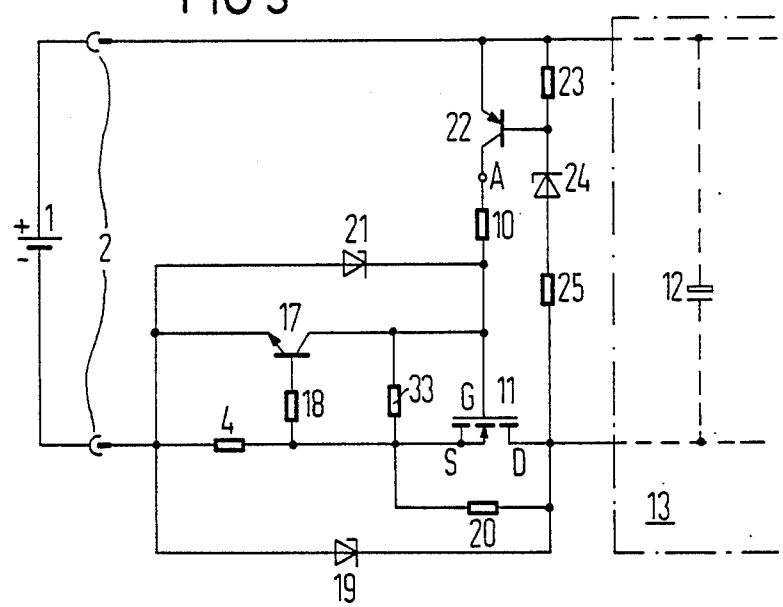

The circuit arrangement shown in FIG. 3 is largely identical to that shown in FIG. 2. In contrast to FIG. 2, the storage capacitor 12 is additionally used as part of the delay element. The voltage divider composed of the resistor 23, the Z-diode 24 and the resistor 25 is arranged in parallel to the storage capacitor 12. The Z-diode 24 is arranged between the two resistors 23 and 25 and is poled in the blocking direction for the charging voltage which occurs across the storage capacitor 12. The transistor 22 is connected by its emitter to the plus pole of the supply voltage source 1 and by its base to the connection point of resistor 23 and Z-diode 24. The resistor 33 is arranged between the gate G and the source S of the field-effect transistor 11.

The collector of the transistor 22 forms the output of the delay circuit and as such leads via the resistor 10 to the gate G of the field-effect transistor 11. The Z-diode 21 is also arranged in parallel to the emitter-collector path of the transistor 17, where the anode of the Z-diode is connected to the emitter of the transistor 17.

In combination with the resistor 20, it is not the charging capacitor 8 in FIG. 2 but the storage capacitor 12 itself which serves as the capacitor of the delay element. The voltage at the output of the protective circuit is detected by means of the voltage divider 23...25. When a predetermined value is overshot the gate G is connected to the positive input voltage via the resistor 10 and the bipolar transistor 22. The Z-diode 21 serves to limit the gate voltage.

The behavior of the circuit arrangement in the case of over voltage pulses is identical to that described for the circuits of FIGS. 1 and 2.

Figure 4:
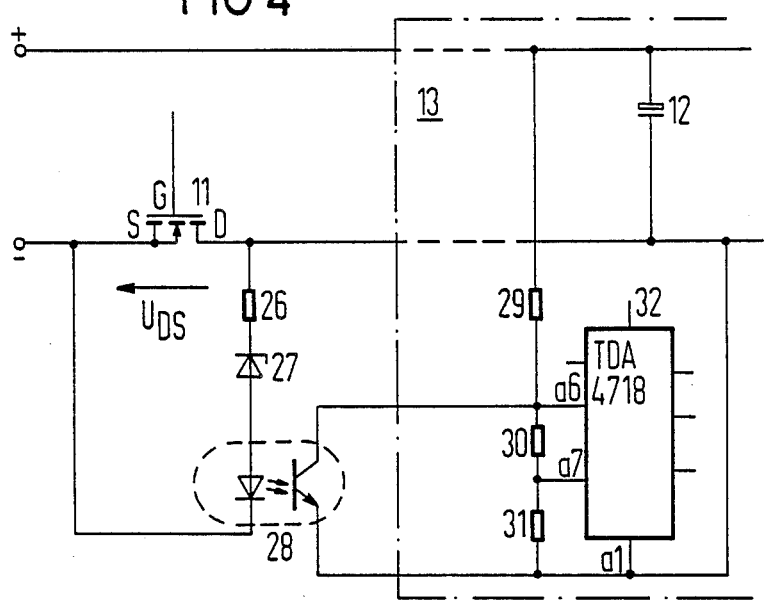
FIG. 4 is a schematic circuit representing an arrangement for a circuit arrangement shown in FIGS. 1–3, in which a field-effect transistor, provided as control element, simultaneously serves as control voltage generator for switching the power supply arrangement on and off.

FIG. 4 represents a device for automatically releasing the power supply arrangement 13 for the circuit arrangements represented in FIGS. 1–3. The electric release of the power supply arrangement 13 and of the actual converter circuit of the current supply device does not take place until the storage capacitor 12 has been virtually completely charged to the respective value of the supply voltage. The voltage which drops across the drain-source path of the field-effect transistor 11 serves as criterion for this state.

The power supply arrangement 13 contains the module 32 of type TDA4718 for example as integrated control circuit. This control module 32 forms part of a clock-controlled converter or the like of a conventional type, for which reason it has not been shown in detail in the FIG. 4.

Of the terminals of the control module 32, only the terminals a1, a6 and a7 have been referenced. The number of these designations in each case corresponds to the terminal number of the integrated module TDA4718. The terminal a6 serves to effect a disconnection in the case of an under voltage, and the terminal a7 serves to effect a disconnection in the case of an over voltage. The disconnection in each case serves to prevent the power supply arrangement 13 from absorbing power.

The terminal a1 for reference potential or OV is connected to the minus pole of the capacitor 12. The voltage divider which consists of the resistors 29, 30 and 31 is located between the positive terminal of the storage capacitor 12 and the terminal a1 of the control module 32. In the case of this voltage divider the resistor 29 is located between the storage capacitor 12 and the terminal a6, the resistor 30 is located between the terminals, a6 and a7, and the resistor 31 is located between the terminals a7 and a1.

On the charging of the storage capacitor 12, which is initially discharged, the voltage across the terminal a6, which is divided in accordance with the divider ratio of the voltage divider, first moves into the region of the under voltage disconnection, so that the control or regulations is at a standstill. The voltage divider is designed to be such that when the transistor component of the opto-coupler 28 is non-conductive the voltage supplied to the terminal a6 leaves the region of the under voltage disconnection as soon as the storage capacitor 12 has charged to a predetermined voltage value. When a predetermined upper limit value of the capacitor voltage is overshot, the voltage occurring at the terminal a7 enters the region of the over voltage disconnection.

The opto-coupler 28 is connected by the emitter-collector path of its transistor component between the terminals a6 and a1. When the transistor component is in the conductive state, the voltage connected to the terminal a6 disappears and thus the disconnection of the control module in the case of under voltage comes into effect. This situation occurs when the drain-source voltage across the MOS-FET 11 exceeds a value which is fundamentally determined by the Zener voltage of the Z-diode 27.

The drain terminal D of the field-effect transistor 11 leads to the source S via a series arrangement composed of the resistor 26, the Z-diode 27 and the diode component of the opto-coupler 28. The Z-diode 27 and the diode component of the opto-coupler 28 are poled in such manner that the Z-diode and the diode component are connected in series with mutually opposing polarities and that the diode component is poled in the conducting direction, relative to the charging current of the storage capacitor 12.

The transistor component of the opto-coupler 28 forms an electronic switch which can be controlled by the drain-source voltage of the MOS-FET 11.

With the assistance of the arrangement shown in Figure 4, the switch mode power supply arrangement 13 is not released until the voltage across the drain-source path of the MOS-FET 11 falls below a predetermined value, i.e. as soon as the storage capacitor 12 fundamentally conforms to the voltage of the supply voltage source 1. This results in the advantage that during the start-up the control component is subject to a lower load because of the shorter charging time.

The circuit which limits the gate voltage of the MOS-FET 11 consists of a Z-diode 7 in FIG. 1, the components 14, 15, 16 in FIG. 2, or the Z-diode 21 in FIG. 3. In place of these devices, which are interchangeable in the aforementioned circuit arrangements, other suitable voltage limiters can be used where appropriate.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

We claim:

1. A circuit arrangement for limiting switch-on current and for providing an over voltage protection in switch mode power supply devices, having a storage capacitor which forms a low-ohmic voltage source for a connected power supply arrangement, and having connecting means for connecting the storage capacitor to a supply voltage source, comprising: between the supply voltage source and the storage capacitor a series circuit consisting of a source-drain path of a field-effect transistor and a current measuring resistor, a gate of the field-effect transistor connected to an output of an OR-circuit whose first input is connected to an output of an amplifier which has a first input connected to the current measuring resistor and which forms a current limiter, and whose other input is connected to an output of a delay component, the delay component being connected between the connecting means and the storage capacitor and which, when the storage capacitor has no charge and is connected to the supply voltage source at the end of a predetermined delay time, the delay component emits from its output a positive potential which renders the field-effect transistor conductive.

2. The circuit arrangement as claimed in claim 1, wherein the OR-circuit includes a decoupling resistor which is arranged between the gate of the field-effect transistor and the output of the delay circuit.

3. The circuit arrangement as claimed in claim 1, wherein the current measuring resistor is arranged between the supply voltage source and the source of the field-effect transistor and wherein the amplifier is connected by its first input, the first input being an inverting input, to a connection point of the current measuring resistor and the source of the field-effect transistor, and wherein the amplifier is formed by a differential amplifier with an open collector output and wherein a non-inverting input of the differential amplifier is connected to an output of a reference voltage generator.

4. The circuit arrangement as claimed in claim 1, the amplifier is formed by a bipolar transistor whose emitter-base path serves as a reference voltage generator and whose emitter is connected to the supply voltage source, whose collector is connected to the gate of the field-effect transistor and whose base is connected via a resistor to the connection point of the current measuring resistor and the source of the field-effect transistor.

5. The circuit arrangement as claimed in claim 1, wherein the delay component is formed by an RC-component which consists of a capacitor and a series-arranged resistor and which is located in parallel to the series circuit composed of the supply voltage source and current measuring resistor and wherein the capacitor of the delay component is connected to the source of the field-effect transistor.

6. The circuit arrangement as claimed in claim 1, wherein a resistor is arranged in parallel to the source-drain path of the field-effect transistor.

7. The circuit arrangement as claimed in claim 6, wherein the delay component is formed by the storage capacitor and components located in its charging circuit, and by an electronic switch which can be controlled by the voltage of the storage capacitor and which is connected to a positive potential which renders the field-effect transistor conductive.

8. The circuit arrangement as claimed in claim 7, wherein the electronic switch is formed by a bipolar transistor whose base is connected to a tapping of a voltage divider arranged in parallel to the storage capacitor and whose emitter is connected to the supply voltage source and whose collector forms the output of the delay circuit.

9. The circuit arrangement as claimed in claim 8, wherein the voltage divider includes in one portion a resistor between the base and emitter of the transistor and in the other portion a series circuit composed of a Zener-diode and a resistor.

10. The circuit arrangement as claimed in claim 1, wherein the series circuit, which is composed of the current measuring resistor and the source-drain path of the field-effect transistor is arranged in parallel with a diode which is poled in the blocking direction for the charging current of the storage capacitor.

11. The circuit arrangement as claimed in claim 1, wherein a power supply arrangement includes a device which can be controlled by the voltage of the storage capacitor and which serves to shut down the power supply arrangement in the event of an under voltage at the input end, and wherein the device which serves to shut down the power supply arrangement can be additionally controlled by the drain-source voltage of the field-effect transistor in such manner that the power supply arrangement is shut down at drain-source voltages which exceed a predetermined limit value.

12. The circuit arrangement as claimed in claim 1, wherein the series circuit, which is composed of the current measuring resistor and the source-drain path of the field-effect transistor is arranged in parallel with a Zener-diode which is poled in the blocking direction for the charging current of the storage capacitor.

13. The circuit arrangement as claimed in claim 1, wherein the current measuring resistor is arranged between the supply voltage source and the source of the field-effect transistor and wherein the amplifier is connected by its first input, the first input being an inverting input, to a connection point of the current measuring resistor and the source of the field-effect transistor, and wherein the amplifier is formed by a differential amplifier with a following decoupling diode and wherein a non-inverting input of the differential amplifier is connected to an output of a reference voltage generator.

* * * * *